(12) United States Patent
Iannotti

(10) Patent No.: US 12,366,600 B2
(45) Date of Patent: Jul. 22, 2025

(54) FAULT ISOLATION SENSOR SYSTEM AND METHODS

(71) Applicant: General Electric Company, Schenectady, NY (US)

(72) Inventor: Joseph Alfred Iannotti, Glenville, NY (US)

(73) Assignee: General Electric Company, Evendale, OH (US)

( * ) Notice: Subject to any disclaimer, the term of this patent is extended or adjusted under 35 U.S.C. 154(b) by 198 days.

(21) Appl. No.: 18/222,173

(22) Filed: Jul. 14, 2023

(65) Prior Publication Data

US 2025/0020709 A1 Jan. 16, 2025

(51) Int. Cl.
 *G01R 31/11* (2006.01)
 *F01D 21/00* (2006.01)
 *G01R 31/00* (2006.01)
 *H02K 11/20* (2016.01)

(52) U.S. Cl.
 CPC ............ *G01R 31/11* (2013.01); *F01D 21/003* (2013.01); *H02K 11/20* (2016.01); *F05D 2260/80* (2013.01); *G01R 31/008* (2013.01)

(58) Field of Classification Search
 USPC ........................................................ 324/533
 See application file for complete search history.

(56) References Cited

U.S. PATENT DOCUMENTS 6,952,798 B2 10/2005 Barksdale, Jr.
8,437,904 B2 5/2013 Mansouri
9,026,273 B2 5/2015 Ziarno
9,026,336 B2 5/2015 Ziarno
9,152,146 B2 10/2015 Ziarno
9,576,404 B2 2/2017 Ziarno
9,760,748 B2 9/2017 Iannotti
9,766,619 B2 9/2017 Ziarno
9,816,897 B2 11/2017 Ziarno
10,005,551 B2 6/2018 Lee
(Continued)

FOREIGN PATENT DOCUMENTS

EP 3244220 11/2017
EP 3805709 4/2021
WO 2014063736 5/2014

OTHER PUBLICATIONS https://www.analog.com/en/technical-articles/log-amps-and-directional-couplers-enable-vswr-detection.html; Title: Log amps and directional couplers enable VSWR detection; Anil Rachakonda and Larry Hawkins; Jan. 2007; (4 pgs.).
(Continued)

*Primary Examiner* — Farhana A Hoque
(74) *Attorney, Agent, or Firm* — McCarter & English, LLP

(57) ABSTRACT

The present disclosure is generally related to a fault isolation sensor system for use with determining whether a potential fault is more likely to be on a rotor side or a stator side. The measurement signals are transmitted from the rotor antenna to the stator antenna, and then from the stator antenna to a controller. The controller is configured to monitor the measurement signals. If the measurement signal is outside of a predetermined range or past a predetermined threshold, then the stator antenna can be interrogated with an interrogation signal with a reflected signal being compared with the interrogation signal and a ratio thereof being used to identify the potential side of the fault.

20 Claims, 5 Drawing Sheets

(56) References Cited

U.S. PATENT DOCUMENTS

| | | |
|---|---|---|
| 10,088,385 B2 | 10/2018 | D'Orlando |
| 10,200,089 B2 | 2/2019 | Lee |
| 10,203,267 B2 | 2/2019 | D'Orlando |
| 10,450,863 B2 | 10/2019 | Jacobs |
| 10,749,612 B1 | 8/2020 | Iannotti |
| 10,996,082 B2 * | 5/2021 | Iannotti .............. G06K 7/10198 |

OTHER PUBLICATIONS https://www.anritsu.com/en-us/test-measurement/solutions/en-us/understanding-cable-and-antenna-analysis; Title: Understanding Cable and Antenna Analysis; copyright 2022 (19 pgs.).
https://www.radioworld.com/news-and-business/the-abcs-of-swr-vswr-reflected-power-and-return-loss; The ABCs of SWR, VSR, Reflected Power and Return Loss; Mike Hendrickson; Dec. 9, 2015; (14 pgs.).

* cited by examiner

FAULT ISOLATION SENSOR SYSTEM AND METHODS

FIELD

This application is generally directed to fault isolation systems and methods and, in particular, such system and methods for use with aviation engines.

BACKGROUND

Aircraft engines, such as internal combustion aircraft engines, include rotary assemblies featuring rotating shafts. Sensors may be used to monitor and measure certain properties of a rotating shaft within the engine to evaluate performance and/or health of the engine. For example, monitoring properties such as torque, temperature, rotating speed, and strain of the shaft may enable early detection of sub-optimal performance and/or components needing maintenance.

Monitoring one or more properties of the rotating shaft of a rotary assembly typically requires one or more discrete sensors installed on or proximate to the shaft. The signals generated by the one or more sensors may be remotely communicated to a processing unit, such as a controller, that is spaced apart from the shaft for analysis of the signals to determine the measured properties. In one example, a shaft antenna is disposed on the rotating shaft and a stator antenna disposed on an adjacent stator. An RF sensor is mounted on the shaft and configured to generate measurement signals as the shaft rotates relative to the stator. Measurement signals from the RF sensor are received by the stator antenna via the shaft antenna. A controller operably connected to the stator antenna can be configured to detect the measurement signals.

If there is an anomaly in the measurement signals detected by the controller, then a fault may be indicated by the controller. However, the measurement signal does not indicate which component or side, e.g., rotor or stator, is the potential cause of the fault. This can undesirably lead to potential inspection and repair of components that are not a likely source of the fault.

BRIEF DESCRIPTION OF THE DRAWINGS

Various needs are at least partially met through provision of a fault isolation sensor system and associated methods for use in an aircraft engine, as described in the following detailed description, particularly when studied in conjunction with the drawings. A full and enabling disclosure of the aspects of the present description, including the best mode thereof, directed to one of ordinary skill in the art, is set forth in the specification, which refers to the appended figures, in which.

Figure 1:
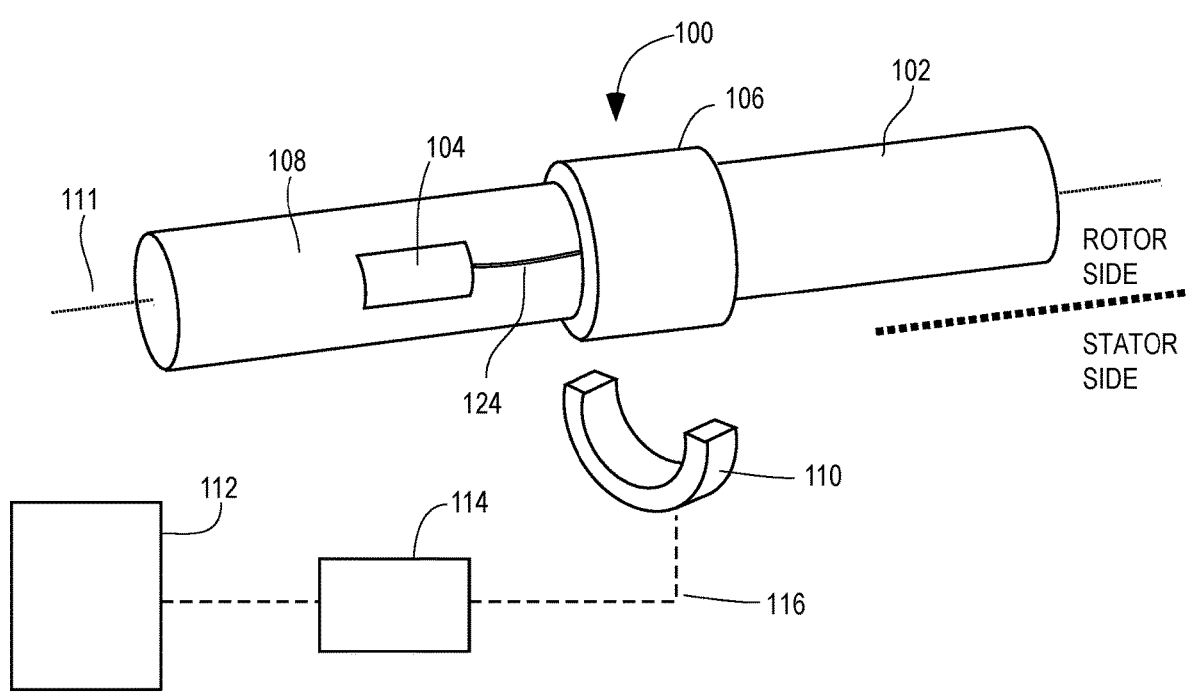
FIG. 1 is a schematic illustration of a fault isolation sensor system incorporated with a shaft of a rotor assembly according to an embodiment.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required.

DETAILED DESCRIPTION

Reference will now be made in detail to present embodiments of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

The terms and expressions used herein have the ordinary technical meaning as is accorded to such terms and expressions by persons skilled in the technical field as set forth above except where different specific meanings have otherwise been set forth herein. The word "or" when used herein shall be interpreted as having a disjunctive construction rather than a conjunctive construction unless otherwise specifically indicated. The terms "coupled," "fixed," "attached to," and the like refer to both direct coupling, fixing, or attaching, as well as indirect coupling, fixing, or attaching through one or more intermediate components or features, unless otherwise specified herein.

The singular forms "a", "an", and "the" include plural references unless the context clearly dictates otherwise.

The term "at least one of" in the context of, e.g., "at least one of A, B, and C" refers to only A, only B, only C, or any combination of A, B, and C.

The terms "forward" and "aft" refer to relative positions within a gas turbine engine or vehicle, and refer to the normal operational attitude of the gas turbine engine or vehicle. For example, with regard to a gas turbine engine, forward refers to a position closer to an engine inlet and aft refers to a position closer to an engine nozzle or exhaust.

The terms "upstream" and "downstream" refer to the relative direction with respect to fluid flow in a fluid pathway. For example, "upstream" refers to the direction from which the fluid flows, and "downstream" refers to the direction to which the fluid flows.

Approximating language, as used herein throughout the specification and claims, is applied to modify any quantitative representation that could permissibly vary without resulting in a change in the basic function to which it is related. Accordingly, a value modified by a term or terms such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin.

Here and throughout the specification and claims, range limitations are combined and interchanged, such ranges are identified and include all the sub-ranges contained therein unless context or language indicates otherwise. For example, all ranges disclosed herein are inclusive of the endpoints, and the endpoints are independently combinable with each other.

As used herein, the term "proximate" refers to being closer to one side or end than an opposite side or end.

It should be understood that the controllers 112 provided herein may implement the various functionality described herein. In terms of hardware architecture, such a controller 112 can include but is not limited to a processor 113, a memory 117, and one or more input and/or output (I/O) device interface(s) that are communicatively coupled via a local interface 119. The local interface can include, for example but not limited to, one or more buses and/or other wired or wireless connections. The processor may be a hardware device for executing software, particularly software stored in a memory. The processor can be a custom made or commercially available processor, a central processing unit (CPU), an auxiliary processor among several processors associated with the computing device, a semiconductor-based microprocessor (in the form of a microchip or chip set) or generally any device for executing software instructions.

The memory devices (e.g., the memory device of the controller 112) described herein can include any one or combination of volatile memory elements (e.g., random access memory (RAM), such as dynamic RAM (DRAM), static RAM (SRAM), synchronous dynamic RAM (SDRAM), video RAM (VRAM), and so forth) and/or nonvolatile memory elements (e.g., read only memory (ROM), hard drive, tape, CD-ROM, and so forth). Moreover, the memory may incorporate electronic, magnetic, optical, and/or other types of storage media. The memory can also have a distributed architecture, where various components are situated remotely from one another, but can be accessed by the processor.

The controllers 112 may implement the functions described herein in any combination of hardware and software (e.g., with the software being executed by a controller). The software may be stored in any memory device and may include one or more separate programs, each of which includes an ordered listing of executable instructions for implementing the functions described herein. When constructed as a source program, the program is translated via a compiler, assembler, interpreter, or the like, which may or may not be included within the memory 117.

It will be appreciated that any of the approaches described herein can be implemented at least in part as computer instructions stored on a computer media (e.g., a computer memory as described above) and these instructions can be executed on a controller such as a microprocessor. However, as mentioned, these approaches can be implemented as any combination of electronic hardware and/or software.

The present disclosure is generally related to a fault isolation sensor system for use with determining whether a potential fault is more likely to be on a rotor side or a stator side. More specifically, the fault isolation sensor system includes a rotor antenna disposed on an outer surface of a shaft configured to rotate about a center axis of the shaft and a stator antenna mounted separate from the shaft such that the rotor antenna rotates with the shaft relative to the stator antenna. A radio frequency (RF) sensor is disposed on the outer surface of the shaft and conductively connected to the rotor antenna. The RF sensor configured to generate measurement signals as the shaft rotates. The measurement signals are transmitted wirelessly from the rotor antenna to the stator antenna, and then from the stator antenna to a controller. The controller is configured to monitor the measurement signals.

If a potential fault condition is identified by the controller based upon the measurement signals, then the stator antenna can be interrogated to facilitate isolation of the potential fault condition. If the interrogation results in a signal indicating a potential fault condition on the stator side, then the stator antenna and other stator-side components can be inspected to identify and/or resolve the fault. If the interrogation does not result in a signal indicating a potential fault condition on the stator side, then the rotor antenna and other rotor-side components can be inspected to identify and/or resolve the fault. A voltage standing wave ratio circuit (VSWRC) can be electrically connected to the stator antenna. The voltage standing wave ratio circuit (VSWRC) has 2 outputs representing the incident wave and reflected wave and with the addition of an analog dividing circuit can be configured to output a voltage ratio of reflected power divided by incident power or reflection coefficient upon interrogation of the stator antenna. If the voltage ratio is <0.2 (or within other predetermined range or ranges or threshold), then the likely fault is not on the stator side, but rather on the rotor side. Optionally, a time domain reflectometer (TDR) can be used to provide not only the amount of reflected energy but in addition the time it takes for the signal to propagate down and back to determine the location of the fault. When used with the voltage standing wave ratio circuit (VSWRC), the time domain reflectometer (TDR) can be used to determine whether the fault or potential fault is on the rotor or stator side and, if the fault or potential fault is on the stator side, where along the stator interconnect path or stator antenna the fault is located. The time domain reflectometer (TDR) can be used alone, without the voltage standing wave ratio circuit (VSWRC) to determine the location of a fault on the stator side. If no fault is identified using the time domain reflectometer (TDR), then that is an indication that the fault is on the rotor side.

FIG. 1 is a schematic illustration of a sensor system 100 incorporated with a shaft 102 of a rotor assembly according to an embodiment. The sensor system 100 includes an RF sensor 104 disposed on the shaft 102 and a rotor antenna 106 also disposed on the shaft 102. For example, both the RF sensor 104 and the rotor antenna 106 are rigidly secured (e.g., fixed in place) on an outer surface 108 of the shaft 102. The RF sensor 104 is conductively connected to the rotor antenna 106 via one or more wires, traces along a substrate, or the like. The shaft 102 is cylindrical and oriented along a center axis 111. The shaft 102 is configured to rotate clockwise and/or counterclockwise about the center axis 111. The RF sensor 104 and the rotor antenna 106 rotate with the shaft 102 about the center axis 111.

The sensor system 100 also includes a stator antenna 110 that is separate and spaced apart from the shaft 102. The stator antenna 110 does not rotate with the shaft 102. The stator antenna 110 is disposed radially outward from the rotor antenna 106. The stator antenna 110 is aligned with the rotor antenna 106, such that the rotor and stator antennas 106, 110 are located at substantially the same position along the length of the axis 111. For example, the stator antenna 110 may radially overlap at least a portion of the rotor antenna 106 such that a line radially extending from the axis 111 through the rotor antenna 106 may intersect the stator antenna 110 as well. The stator antenna 110 may be mounted on or to a stator 118 (shown in FIG. 2) that is discrete from the shaft 102. The stator member optionally may represent or may be disposed within an electrically conductive enclosure that provides electromagnetic shielding. The stator antenna 110 may be rigidly secured to the stator 118. The rotor antenna 106 is radially spaced apart from the stator antenna 110 by an air gap 122. The rotor antenna 106 is wirelessly, such as inductively, connected to the stator antenna 110 across the air gap 122.

Figure 2:
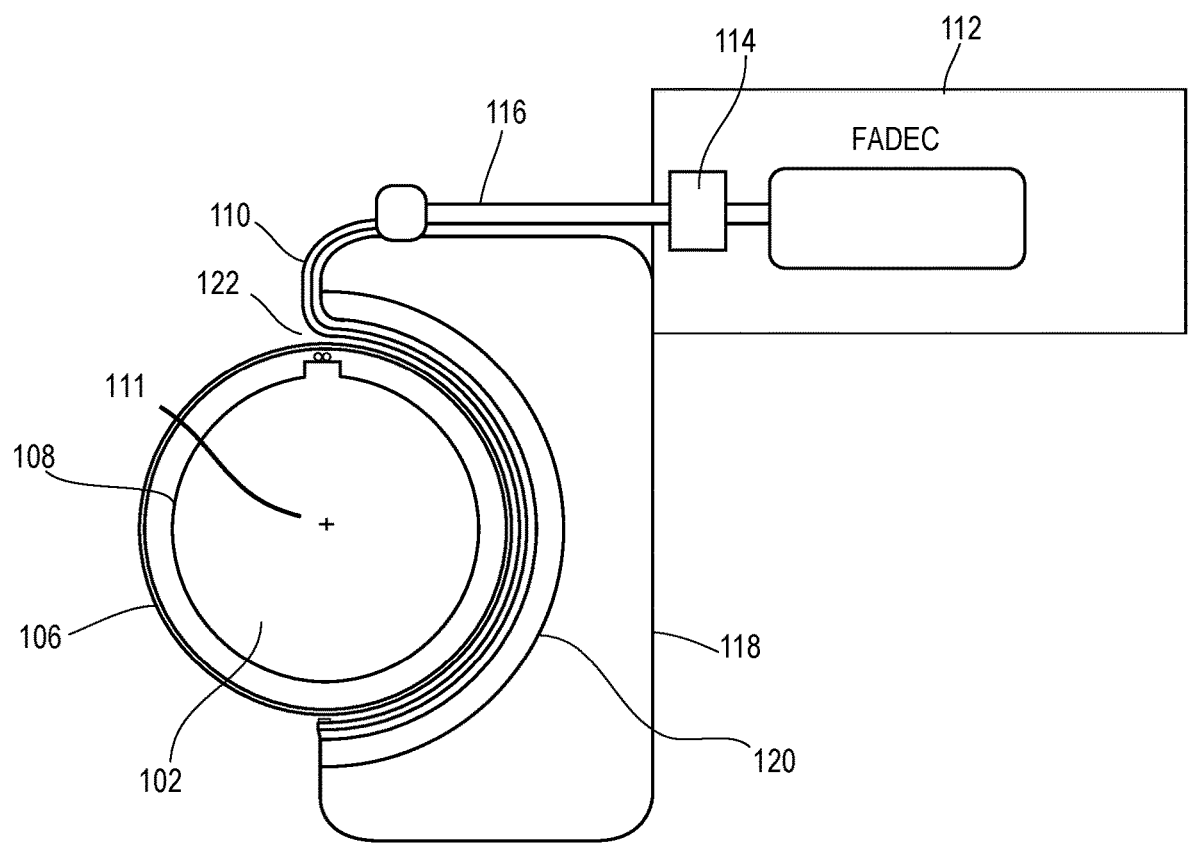
FIG. 2 illustrates a schematic, cross-sectional perspective view of the fault isolation sensor system incorporated with a rotor assembly according to an embodiment.

In a non-limiting example, the rotor antenna 106 is an annular ring that extends around a fully circumference of the shaft 102, and the stator antenna 110 is an arc that surrounds a circumferential portion of the shaft 102 less than the full circumference, as shown in FIGS. 1 and 2.

The stator antenna 110 is communicatively connected to a controller 112 of the sensor system 100. The controller 112 is spaced apart from the shaft 102. The controller 112 may be connected to the stator antenna 110 via a wired pathway 116. In operation, the RF sensor 104 is configured to generate measurement signals as the shaft 102 spins or rotates. The measurement signals are communicated from the RF sensor 104 to the rotor antenna 106, and from the rotor antenna 106 to the stator antenna 110 across the air gap 122. The controller 112 monitors one or more electrical characteristics of the measurement signals over time as the shaft 102 rotates. The controller 112 is configured to determine the one or more properties of the shaft 102 based on the electrical characteristics of the measurement signals.

In an embodiment, the RF sensor 104 may be a passive sensor module that does not have an onboard or connected power source, such as a battery or energy harvesting device. The RF sensor 104 may be configured to generate the measurement signals in response to receiving stimulus signals, such that the energy of the stimulus signals is utilized to power the generation and communication of the measurement signals. For example, the controller 112 may represent both an interrogator and a reader. As an interrogator, the controller 112 generates a stimulus signal and controls the transmission of the stimulus signal from the stator antenna 110 to the RF sensor 104 via the rotor antenna 106. The RF sensor 104 may generate a measurement signal upon receipt of the stimulus signal by utilizing the energy of the stimulus signal. As a reader, the controller 112 receives and analyzes the measurement signal that is generated by the RF sensor 104 responsive to receiving the stimulus signal. Having the voltage standing wave ratio circuit (VSWRC) 114 between the controller 112 and the stator antenna 110 advantageously allows for the interrogation of the stator antenna 110. More specifically, if the controller 112 determines that the measurement signal indicates a potential fault the controller 112 can send an interrogation signal to the stator antenna 110 via the voltage standing wave ratio circuit VSWRC 114. The voltage standing wave ratio circuit VSWRC 114 can compare the ratio of the interrogation signal to a reflected signal. If the ratio is outside predetermined range or ranges, or past a predetermined threshold, then the controller 112 can indicate that there is a potential fault condition on the stator side. If the ratio is within the predetermined limits, then the controller 112 can indicate that there is a potential fault condition on the rotor side. The predetermined range or ranges or predetermined threshold or thresholds can be stored in memory of the controller 112. Advantageously, having an indication as to the source, or the likely source, of the fault can speed up inspection and repair. As described above, in addition to or instead of the voltage standing wave ratio circuit (VSWRC) 114, an optional time domain reflectometer (TDR) 115 can be present. The time domain reflectometer (TDR) 115 can be incorporated into the controller 112 or be separate and communicate with the controller 112.

In an embodiment, the components of the sensor system 100 disposed on the shaft 102 are passive, which avoids mounting batteries or other active power components on or near the shaft 102. Such active power components may interfere with narrow clearances in the rotor assembly. Without having active power components, the shaft-mounted components of the sensor system 100 may be relatively thin and able to fit within narrow clearances between the shaft and the stator. The sensor system 100 may be retrofit onto existing rotor assemblies that are not designed to accommodate sensors disposed on the shafts.

Although a single RF sensor 104 is shown in FIG. 1, the sensor system 100 may include multiple RF sensors 104 mounted at different locations on the shaft 102. For example, another RF sensor 104 may be disposed on the outer surface 108 of the shaft 102 at an opposite circumferential position relative to the visible RF sensor 104 (e.g., along a back-facing circumferential region of the shaft). A stator antenna 110 is positioned adjacent the rotor antenna 106 and spaced therefrom by an air gap. The stator antenna 110 is operably connected to a controller 112. A voltage stand wave ratio circuit (VSWRC) 114 is operably connected between the controller 112 and the stator antenna 110. The controller 112 may be configured to receive measurement signals generated by the RF sensor 104 when determining one or more properties of the shaft 102, such as torque, bending, fatigue, stress, strain rate, or the like. The controller 112 is configured to interrogate the stator antenna 110 by sending a signal, through the voltage stand wave ratio circuit (VSWRC) 114, to the stator antenna 110. The reflected signal is compared with the sent signal to determine a ratio. That ratio is received by the controller 112 and the controller 112 can, depending upon the ratio, indicate a likely fault on either the stator side or the rotor side.

The sensor system 100 optionally may include more than one rotor antenna 106 and more than one stator antenna 110 located at different axial locations along the length of the shaft 102. For example, the illustrated rotor antenna 106 and stator antenna 110 can define a first wirelessly connected pair, and the sensor system 100 may include at least one other wirelessly connected pair spaced apart from the first wirelessly connected pair. For example, a second wirelessly connected pair may be configured to communicate measurement signals generated by a second RF sensor to the controller 112. The controller 112 may be configured to compare the measurement signals generated by the multiple different RF sensors 104 when determining one or more properties of the shaft 102, such as torque, bending, fatigue, stress, strain rate, or the like.

FIG. 2 is a schematic, cross-sectional perspective view of the sensor system 100 incorporated with a rotor assembly that includes the shaft 102 and a stator 118. The rotor antenna 106 is disposed on the outer surface 108 of the shaft 102. The stator 118 has a concave recess 120 that has a shape complementing that of the shaft 102. The stator antenna 110 is attached to the concave recess 120 of the stator 118. The stator antenna 110 is electrically connected to the voltage standing wave ratio circuit (VSWRC) 114 via the wired pathway 116, such as an RF coaxial cable, and the voltage standing wave ratio circuit (VSWRC) 114 is connected via RF coaxial cable to the controller 112. In the example of FIG. 2, the controller 112 is or is part of a Full Authority Digital Engine Control (FADEC). The indication of the location of the fault or the potential location of the fault can be accomplished in a variety of ways, including using the FADEC. The indication can be audible, such as using a speaker, or visual. For instance, a display can provide the information. The display can be operably connected to the controller, including remotely connected. Moreover, the connection does not have to be continuous.

Figure 3:
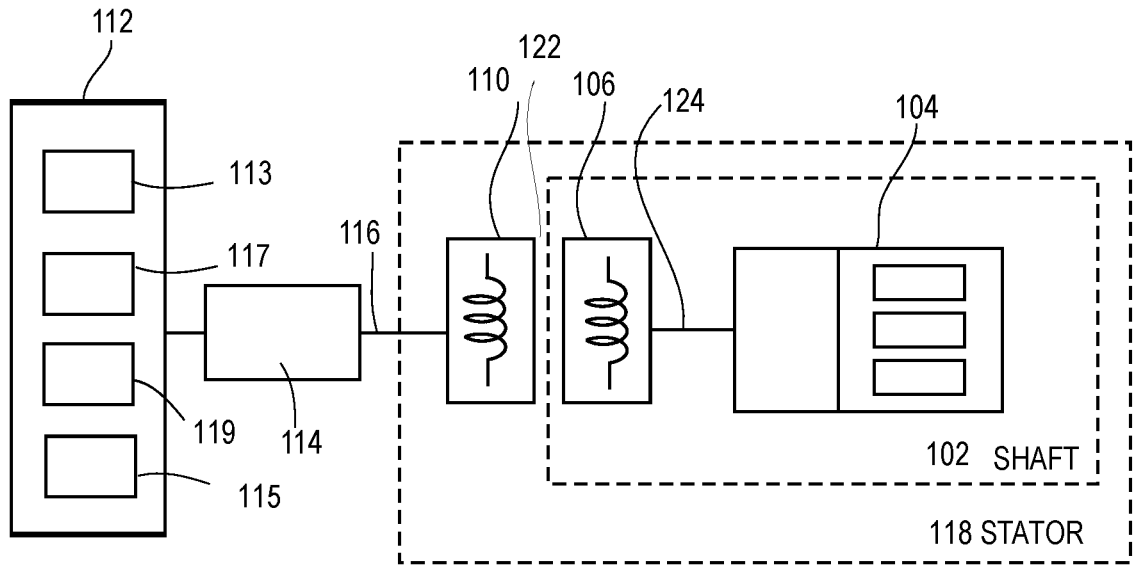
FIG. 3 is a block diagram of the fault isolation sensor system according to an embodiment.

FIG. 3 is a block diagram of the sensor system 100 according to an embodiment. Optionally, the controller 112 may be remote from stator 118 on which the stator antenna 110 is mounted. The controller 112 may be conductively connected to the stator antenna 110 by the wired pathway 116, such as the RF coaxial cable, with the voltage standing wave ratio circuit (VSWRC) 114 intermediate. The rotor antenna 106 may be conductively connected to the RF sensor 104 via a conductive signal path 124 along the shaft 102, which may be provided by one or more wires. Optionally, the rotor antenna 106 is directly connected to a portion of the RF sensor 104, such as a printed circuit board or substrate of the RF sensor 104, without a discrete wire traversing a space between the antenna 106 and the RF sensor 104.

Figure 4:
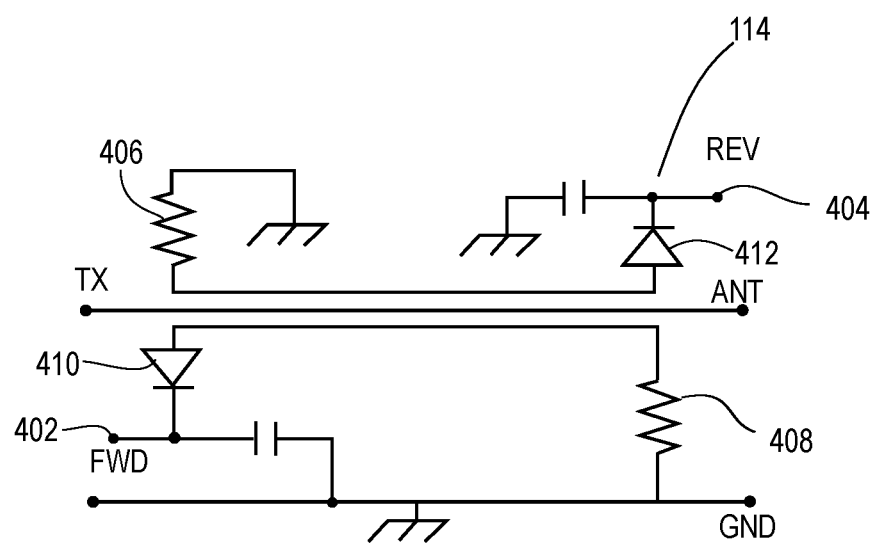
FIG. 4 is diagram of a voltage standing wave ratio circuit (VSWRC) for use with an embodiment of the fault isolation sensor system.

FIG. 4 is a diagram of the voltage standing wave ratio circuit (VSWRC) 114 for use with an embodiment of the fault isolation sensor system 100. VSWRC 114 includes a passive 4-port RF network containing two transmission lines 402, 404, two termination resistors 406, 408 and two RF power detectors 410, 412, comprised of rectifying diodes and filtering capacitors. The VSWRC 114 measures forward and reverse RF energy when an interrogation signal is sent by the controller 112. By dividing the reflected energy by incident energy, such as by using the controller 112 or an analog divider circuit, the VSWRC 114 can be used to monitor the RF interconnect integrity of the stator antenna 110 and other components electrically or otherwise connected to the stator antenna 110. Similarly, the TDR 115 can be used to measure forward and reverse RF energy when an interrogation signal is sent by the controller 112 or by the TDR 115. The TDR 115 can also be used to determine the time for the return RF signal, which can beneficially be used by the TDR 115 and/or the controller 112 to indicate a location or potential location of a fault on the stator side.

The RF sensor 104 in the illustrated embodiment of FIG. 4 is a surface acoustic wave (SAW) sensor. The RF sensor 104 may be an all-quartz-package surface acoustic wave (SAW) sensor. For example, the sensor 104 may be sealed between a quartz substrate and a second quartz layer. The surface acoustic wave (SAW) sensor 104 may include a first resonator, a second resonator, and a third resonator. The resonators may be disposed on a common substrate. The substrate may include quartz. The substrate may be affixed to the shaft 102 via an adhesive that is applied on an inner surface of the substrate that faces the shaft 102. The surface acoustic wave (SAW) sensor 104 optionally includes the circuit board that includes, or is connected to, the substrate. The location of the RF sensor 104 on the shaft 102 provides for direct measurement of one or more properties, such as strain and temperature, via the resonators. For example, the first and second resonators may measure strain, and the third resonator may measure temperature. The strain measurements can be used to derive torque. Optionally, the strain resonators may be configured to resonate at different frequencies.

In an embodiment, the surface acoustic wave (SAW) sensor 104 is passive and is powered by receiving stimulus signals. Each stimulus signal transmitted via the rotor and stator antennas 106, 110 to the surface acoustic wave (SAW) sensor 104 may have a broad frequency spectrum. The spectrum of the stimulus signal may define an operating frequency range of the surface acoustic wave (SAW) sensor 104. The surface acoustic wave (SAW) sensor 104 converts the electrical stimulus signals into acoustic signals that travel along the surface of the shaft 102. The measurement signals generated by the surface acoustic wave (SAW) sensor 104 may include the broad spectrum of the stimulus signal with nulls or voids in the spectrum that represent the frequencies at which the resonators resonate. The controller 112 receives the measurement signals from the stator antenna 110 and can determine the resonating frequencies of the resonators based on these nulls in the spectrum. The controller 112 is configured to determine one or more properties of the shaft 102, such as strain, torque, temperature, or the like, based on the determined resonating frequencies of the resonators.

Figure 5:
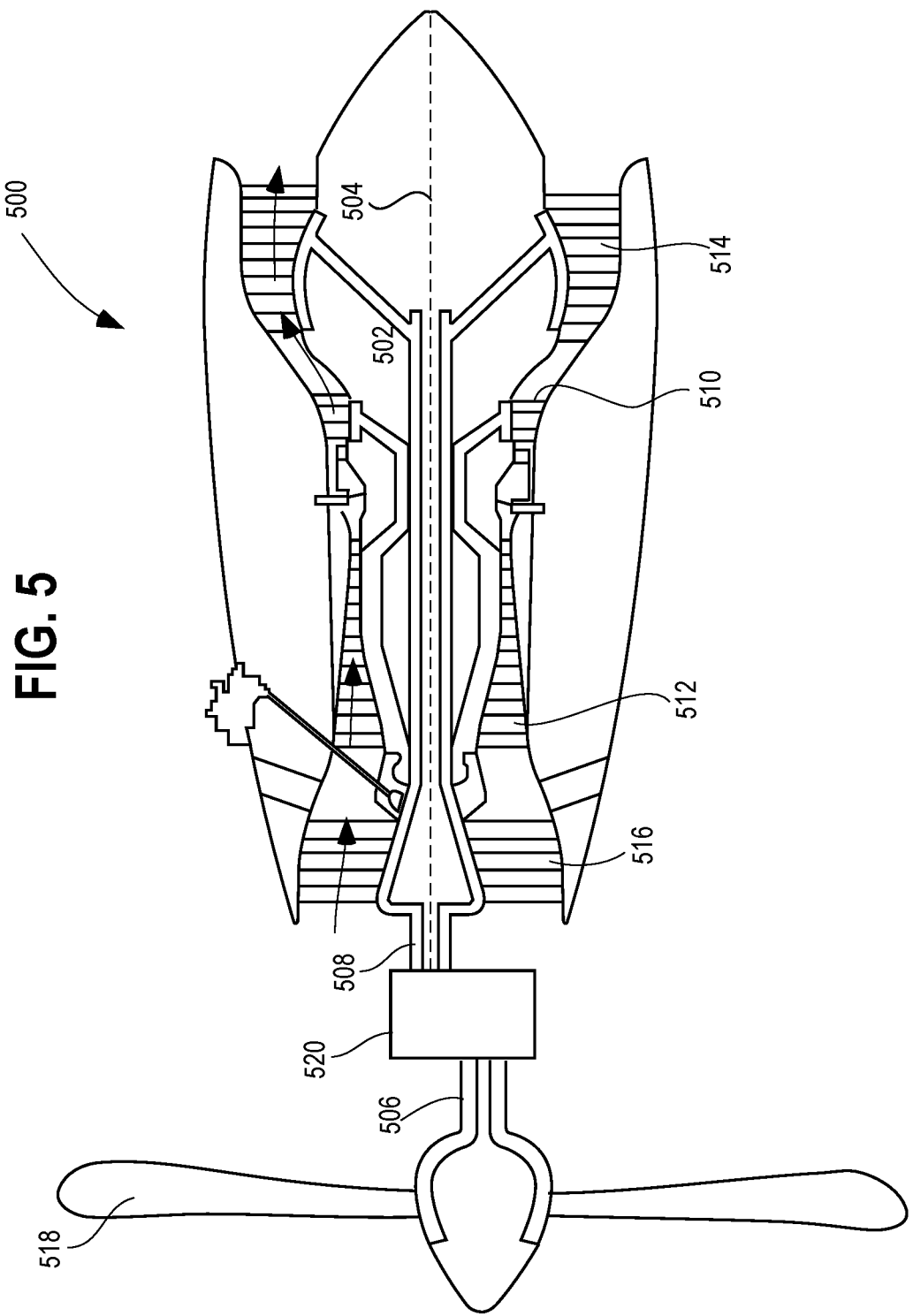
FIG. 5 is a schematic cross-sectional view of an aircraft engine according to an embodiment.

A schematic cross-sectional view of an exemplary embodiment of an aircraft engine 500 is depicted in FIG. 5. The aircraft engine 500 is a combustion engine, such as a high bypass turboprop type engine. The engine in other non-limiting examples may include or represent other turbine-powered engines, such as a turboshaft engine, a turbofan engine, or the like. The aircraft engine 500 includes various rotating shafts, such as a high-pressure shaft 502, a low-pressure shaft 504, a fan shaft 506, and an engine coupling shaft 508. The high-pressure shaft 502 connects a high-pressure turbine 510 to a high-pressure compressor 512. The lower pressure shaft 504 connects a low-pressure turbine 514 to a low-pressure compressor 516. The fan shaft 506 connects to a fan section or propeller 518. The engine coupling shaft 508 connects a speed reduction device 520 to the low-pressure shaft 504. These shafts 502, 504, 506, 508 may represent different rotor assemblies or different components of a single rotor assembly.

The sensor system 100 may be incorporated into the aircraft engine 500. The sensor system 100 may be incorporated with at least one of these shafts 502, 504, 506, 508 to monitor properties of the shafts such as, but not limited to, strain, torque, temperature, or rotational speed. The controller 112 may be configured to control the operation of the aircraft engine 500 based on one or more determined properties of the shaft 502. For example, the aircraft engine 500 may have a designated torque value or range. If the sensor system 100 determines a torque value for the shaft 502 that is outside of a predetermined torque range, the controller 112 may generate a control signal configured to change an operating setting of the aircraft engine 500, such as to increase the power output of the aircraft engine 500 or to decrease the power output based on the determined torque value. Although the aircraft engine 500 shown in FIG. 5 is a combustion engine, the sensor system 100 described herein may be incorporated with other types of engines or machines that include rotor assemblies (e.g., rotating shafts). Such machines may include motors, generators, other types of engines, and the like.

While the fault isolation sensor system is generally described as being configured to monitor a SAW sensor on a stator of an engine herein, the fault isolation sensor system can be used to perform fault isolation on various electronic components of an engine such as temperature sensors, pressure sensors, vibration sensors, speed sensors, position sensors, flow sensors, accelerometers, etc. The fault isolation sensor system may further monitor electronic components on various parts of an engine, such as the housing, the rotor, the shaft, the inlet, the exhaust, etc. Generally, the fault isolation sensor system allows for fault isolation of relatively accessible components of an engine to assist in determining whether inspections and repairs of less accessible components may be required.

The sensor system 100 described herein can enable determination as to whether there is an interconnect fault at some location along the stator portion of the SAW system. Optionally, using TDR can enable determination of the physical location of the interconnect fault along the length of the interconnect of the stator portion, e.g., including the stator antenna 110, of the SAW system.

In one embodiment, the stator portion of the SAW system, includes some or all of a connector at the FADEC, a cable harness between the FADEC and a booster compartment, an RF bias tee associated with a one-wire interfaced calibration EEPROM (electrically erasable programmable read-only memory), cabling internal to an engine, and an interface with the stator antenna 110 and an associated termination resistor, and the stator antenna 110.

The SAW system can have health monitoring integrated into the operation of the system which can identify a degradation in system performance. This health monitoring can use the derived resonator quality factor and/or measurement noise associated with the calculation of a specific resonator frequency to aid in determining if system degradation is occurring. If the quality factor of the resonator is degrading, then that can indicate a degradation in the rotor SAW sensor or sensor die on the shaft 102. If an increase in this standard deviation value is detected then either a voltage standing wave ratio measurement and/or time domain reflectometry measurement is performed, and those results indicate normal operation and no degradation observed, then it can be inferred that the added system RF loss is due to system components attached to the shaft 102 and not the stator side. Conversely, if either a voltage standing wave ratio measurement and/or time domain reflectometry measurement is performed, and those results show a degradation, then it is likely that the issue resides on the stator side and the shaft 102 and associated components are not the source of a potential fault.

If a fault is detected on the stator side using the voltage standing wave ration measurement, then optionally it can be desirable to determine where along the length of the interconnect path the degradation is occurring. This can be accomplished using the time domain reflectometer (TDR) 115. The TDR 115 can be used to identify where along the interconnect path the fault is occurring or potentially occurring and tell an operator what component needs to be inspected or replaced on the stator side of the SAW system.

Examples of types of failure modes that can be identified include the following, as well as any combination of one or more of the following: a failure on the rotor side of the SAW system; a failure associated with the cabling between the FADEC and the booster compartment; a failure associated with the RF bias T and/or electrical overstress protection circuit associated with the EEPROM calibration device; a failure associated with the cabling between the EEPROM calibration device and stator antenna 110; a failure associated with the interconnect of the cabling to the stator antenna 110; a failure associated with the stator antenna trace cracking and/or antenna ablation; and a failure associated with the termination resistor of the stator antenna caused by SMT solder joint fatigue or cracking.

Figure 6:
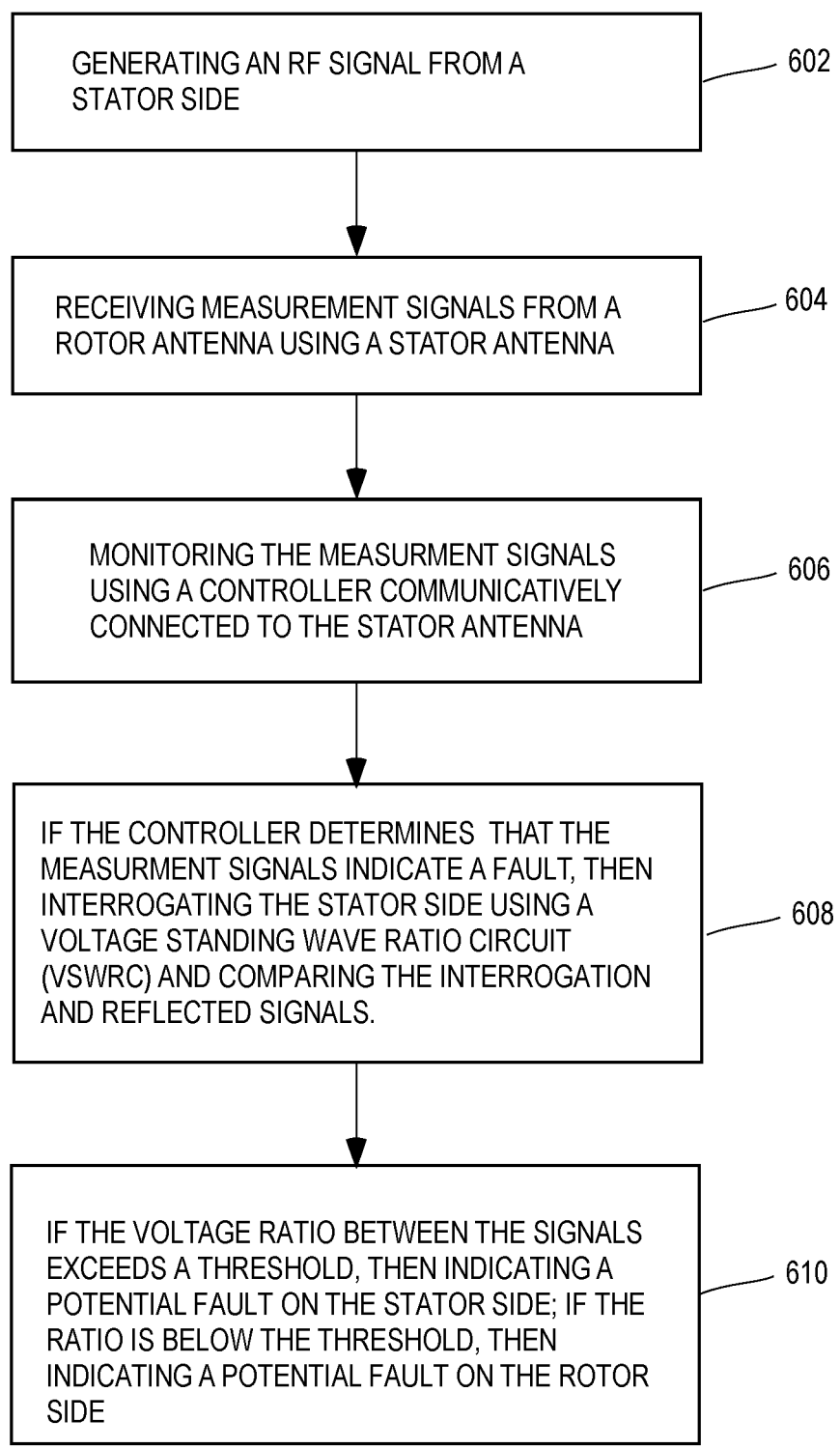
FIG. 6 is a flow chart for a method of using a fault isolation sensor system to isolate a fault on an aircraft engine.

A method of isolating a fault using the sensor system 100 is depicted in FIG. 6, where the sensor system 100 includes the rotatable shaft 102 having the rotor antenna 106 disposed on the outer surface thereof 108, the stator antenna 110 mounted separate from the shaft 102 such that the rotor antenna 106 rotates with the shaft 102 relative to the stator antenna 110. The method can include generating an RF signal from a stator side, as referenced at step 602 in FIG. 6. The RF signal can be generated during rotation of the shaft 102 and/or when the shaft 102 is not rotating. The method can also include receiving measurement signals from the rotor antenna 106 using the stator antenna 110, as referenced at step 604 in FIG. 6. The method can also include monitoring the measurement signals using a controller 112 communicatively connected to the stator antenna 110, as referenced at step 606 in FIG. 6. If the controller 112 determines that the measurement signals indicate a fault, then an interrogation signal is sent via the voltage standing wave ratio circuit (VSWRC) 114, with the interrogation and reflected signals compared, as referenced at step 608 of FIG. 6. If the voltage ratio between the signals is above a threshold, then a potential fault on the stator side is indicated; if the ratio is below the threshold, then a potential fault on the rotor side is indicated, as referenced at step 610 of FIG. 6.

The threshold can be predetermined or dynamic. For example, a threshold can be 1, 0.2 or another number. Instead of a threshold, a range can be used instead. The ratio can be considered a reflected voltage divided by an incident voltage, which can give a reflection coefficient. In other words, the amplitude of the interrogation signal that is sent is known, and when the reflected amplitude is greater than a threshold (or range), e.g., 0.2, then that can indicate a potential fault in the stator side.

The sensor system 100 and/or methods described herein can be used on any suitable system where isolation and differentiation of faults is desirable. The sensor system 100 and/or methods advantageously can be used to isolate and differentiate among faults on easily accessible or replaceable elements of an engine or other system, on the one hand, and less accessible or more difficult to replace elements, on the other hand. For example, a reduction in repair time can be achieved if the sensor system 100 indicates that a potential fault is associated with an easily accessible or replaceable element as opposed to a less accessible or replaceable element because the repair can begin with addressing the easily accessible or replaceable element. If the sensor system 100 indicates that a potential fault may be associated with a less accessible or replaceable element, then efficiencies in repair can be achieved by addressing that element first, as well as potential planning of the time required for such repair and potentially scheduling other maintenance or repairs on such an element or adjacent structures. The sensor system 100 and/or methods described herein can isolate one fault from other actual or potential faults, for example, and can differentiate between faults. When used with the TDR, or when the TDR is used alone, more specific information about the location or potential location of a fault can be determined, as described above. For instance, the TDR can indicate a fault or a potential fault at a certain location or distance along the stator interconnect path or stator antenna, or another component such as electronic components on various parts of an engine, such as the housing, the rotor, the shaft, the inlet, the exhaust, etc.

Further aspects of the disclosure are provided by the subject matter of the following clauses:

A fault isolation sensor system is provided that can include a rotor antenna disposed on an outer surface of a shaft configured to rotate about a center axis of the shaft, a radio frequency (RF) sensor disposed on the outer surface of the shaft and conductively connected to the rotor antenna, the RF sensor configured to generate measurement signals, a stator antenna mounted separate from the shaft such that the rotor antenna rotates with the shaft relative to the stator antenna, the stator antenna wirelessly connected to the rotor antenna across an air gap to receive the measurement signals from the rotor antenna, and a controller communicatively connected to the stator antenna, the controller configured to monitor the measurement signals received from the stator antenna to determine one or more properties of the shaft. The system further may include at least one of a voltage standing wave ratio circuit (VSWRC) electrically connected relative to the stator antenna and the controller, the VSWRC configured to determine a reflection coefficient of a stator side interconnect patch and antenna; and a time domain reflectometer (TDR) for sending a TDR interrogation signal and receiving a TDR reflected signal and determining a voltage ratio between the TDR interrogation signal and the TDR reflected signal over time.

The system of the preceding clause may further have the controller configured to compare the voltage ratio with a predetermined threshold or range. The controller may also be configured to output a fault signal if the voltage ratio is past the predetermined threshold or outside the range.

The system of any of the preceding clauses may have the VSWRC configured to divide reflected energy by incident energy to output the voltage ratio to the controller.

The system of any of the preceding clauses may include the time domain reflectometer (TDR). The time domain reflectometer (TDR) may be configured to determine the time for receiving a TDR reflected signal and, based upon the time, output an indication of the location of a fault on the stator antenna.

The system of any of the preceding clauses may have the voltage standing wave ratio circuit (VSWRC).

The system of any of the preceding clauses may have both the voltage standing wave ratio circuit (VSWRC) and the time domain reflectometer (TDR).

The system of any of the preceding clauses may have the shaft and rotor as part of an aircraft engine.

The system of any of the preceding clauses may have the controller comprising a Full Authority Digital Engine Control (FADEC).

A fault isolation system is provided that includes means for isolating a fault or potential fault, such as indicating whether a fault or potential fault is on a rotor side or a stator side of a component, such as a rotating shaft of an engine.

A method is provided for determining whether a fault is on the rotor or the stator side of the sensing system using the fault isolation sensor system of any of the preceding clauses. The method may include comparing the voltage ratio with a predetermine range or threshold using the controller and, if the voltage ratio between the interrogation signal and the reflected signal is outside of a predetermined range or past a predetermined threshold, then indicating that the fault is in the stator antenna and, if not, then indicating that the fault is in the rotor antenna.

A method is provided for determining whether a fault is on the rotor side or the stator side using the fault isolation sensor system of any of the preceding clauses, where the system includes a time domain reflectometer (TDR). The method may include comparing the voltage ratio with a predetermine range or threshold using the controller and, if the voltage ratio between the interrogation signal and the reflected signal is outside of a predetermined range or past a predetermined threshold, then indicating that the fault is in the stator side and, if not, then indicating that the fault is in the rotor side; and if the fault is on the stator side, then determining the time for the signal to propagate and return along the stator antenna to identify the location of the fault.

A method is provided for isolating a fault in a sensor system, the sensor system including a rotatable shaft having a rotor antenna disposed on an outer surface thereof, a stator antenna mounted separate from the shaft such that the rotor antenna rotates with the shaft relative to the stator antenna. The method may include generating measurement signals; transmitting the measurement signal from the rotor antenna to the stator antenna; monitoring the measurement signal received from the stator antenna to determine one or more properties of shaft; sending an interrogation signal to the stator antenna if the measurement signal is outside of a predetermined range or past a predetermined threshold; comparing the interrogation signal with a reflected signal; and, if a ratio between the interrogation signal and the reflected signal is outside of a predetermined range or past a predetermined threshold, then indicating that the fault is on the stator side and, if not, then indicating that the fault is in the rotor side.

The system of the method of the preceding clause may include a radio frequency (RF) sensor that is disposed on the shaft and is configured for performing the step of generating measurement signals both as the shaft rotates and when the shaft does not rotate.

The system of the method of the preceding clause may include a voltage standing wave ratio circuit (VSWRC) electrically connected relative to the stator antenna, the VSWRC being configured for performing the step of comparing the interrogation signal with a reflected signal.

The system of the method of the preceding clause may include a controller configured for indicating that the fault is on the stator side or the fault is on the rotor side.

The method of any the preceding clauses, where if indicating that the fault is on the stator side, then propagating a signal and measuring time of the signal reflection to identify a location of the fault along the stator antenna.

The method of any of the preceding clauses, where the sensor system is on a shaft of an aircraft engine.

A controller can be provided that is configured for use in isolating a fault in a sensor system. The sensor system optionally may include a rotatable shaft having a rotor antenna disposed on an outer surface thereof and a stator antenna mounted separate from the shaft such that the rotor antenna rotates with the shaft relative to the stator antenna. The controller can be configured to generate measurement signals; transmit the measurement signal from the rotor antenna to the stator antenna; and monitor the measurement signal received from the stator antenna to determine one or more properties of shaft. The controller can also be configured to send an interrogation signal to the stator antenna if the measurement signal is outside of a predetermined range or past a predetermined threshold; compare the interrogation signal with a reflected signal; and, if a ratio between the interrogation signal and the reflected signal is outside of a predetermined range or past a predetermined threshold, then indicating that the fault is on the stator side and, if not, then indicating that the fault is in the rotor side. The controller can optionally be used with any of the preceding clauses.

Means for indicating the location of a fault or potential fault can be provided as part of any of the preceding clauses. The means for indicating the location of the fault or potential fault can include a visible and/or audible alert or other notification.

Those skilled in the art will recognize that a wide variety of modifications, alterations, and combinations can be made with respect to the above-described embodiments without departing from the scope of the disclosure, and that such modifications, alterations, and combinations are to be viewed as being within the ambit of the disclosure concept.

What is claimed is:

1. A fault isolation sensor system comprising:
   a rotor antenna disposed on an outer surface of a shaft configured to rotate about a center axis of the shaft;
   a radio frequency (RF) sensor disposed on the outer surface of the shaft and conductively connected to the rotor antenna, the RF sensor configured to generate measurement signals;
   a stator antenna mounted separate from the shaft such that the rotor antenna rotates with the shaft relative to the stator antenna, the stator antenna wirelessly connected to the rotor antenna across an air gap to receive the measurement signals from the rotor antenna;
   a controller communicatively connected to the stator antenna, the controller configured to monitor the measurement signals received from the stator antenna to determine one or more properties of the shaft; and
   at least one of:
      a voltage standing wave ratio circuit (VSWRC) electrically connected relative to the stator antenna and the controller, the VSWRC configured to determine a reflection coefficient of a stator side interconnect path and antenna; and
      a time domain reflectometer (TDR) for sending a TDR interrogation signal and receiving a TDR reflected signal and determining a voltage ratio between the TDR interrogation signal and the TDR reflected signal over time.

2. The fault isolation sensor system of claim 1, wherein the controller is configured to compare the voltage ratio with at least one of a predetermined threshold or range.

3. The fault isolation sensor system of claim 2, wherein the controller is configured to output a fault signal if the voltage ratio is at least one of past the predetermined threshold or outside the range.

4. The fault isolation sensor system of claim 1, wherein the VSWRC divides reflected energy by incident energy to output the voltage ratio to the controller.

5. The fault isolation sensor system of claim 1, wherein, when the fault isolation sensor system includes the TDR, the TDR is configured to determine the time for receiving a TDR reflected signal and, based upon the time, output an indication of a fault location on the stator antenna.

6. The fault isolation sensor system of claim 1, wherein, when the fault isolation sensor system includes the TDR, the TDR is configured to determine the time for receiving a TDR reflected signal and, based upon the time, output an indication of a fault location on the a stator interconnect path.

7. The fault isolation sensor system of claim 1, comprising the voltage standing wave ratio circuit (VSWRC) and the time domain reflectometer (TDR).

8. The fault isolation sensor system of claim 1, wherein the shaft is part of an aircraft engine.

9. The fault isolation sensor system of claim 8, wherein the shaft is one of a high-pressure shaft, a low-pressure shaft, a fan shaft, and an engine coupling shaft.

10. The fault isolation sensor system of claim 1, wherein the controller comprises a Full Authority Digital Engine Control (FADEC).

11. A method of determining whether a fault is on a rotor side or a stator side of the system using the fault isolation sensor system of claim 1, the method comprising:
    comparing the voltage ratio with a predetermine range or threshold using the controller and, if the voltage ratio between the TDR interrogation signal and the TDR reflected signal is outside of a predetermined range or past a predetermined threshold, then indicating that the fault is in the stator antenna and, if not, then indicating that the fault is in the rotor antenna.

12. A method of determining whether a fault is on a rotor side or a stator side using the fault isolation sensor system of claim 5, the method comprising:
    comparing the voltage ratio with a predetermine range or threshold using the controller and, if the voltage ratio between the TDR interrogation signal and the TDR reflected signal is outside of a predetermined range or past a predetermined threshold, then indicating that the fault is on the stator side and, if not, then indicating that the fault is on the rotor side; and
    when the fault is on the stator side, then determining the time for the signal to propagate and return along the stator antenna to identify the fault location.

13. A method of isolating a fault in a sensor system, the sensor system comprising a rotatable shaft having a rotor antenna disposed on an outer surface thereof, a stator antenna mounted separate from the shaft such that the rotor antenna rotates with the shaft relative to the stator antenna, the method comprising;
    generating a measurement signal;
    transmitting the measurement signal from the rotor antenna to the stator antenna;
    monitoring the measurement signal received from the stator antenna to determine one or more properties of the shaft;
    sending an interrogation signal to the stator antenna if the measurement signal is outside of a predetermined range or past a predetermined threshold;
    comparing the interrogation signal with a reflected signal; and
    if a ratio between the interrogation signal and the reflected signal is outside of a predetermined range or past a predetermined threshold, then outputting an indication that the fault is on a stator side and, when not, then outputting an indication that the fault is in a rotor side.

14. The method of claim 13, wherein a radio frequency (RF) sensor is disposed on the shaft and is configured for at least in part performing the step of generating measurement signals both as the shaft rotates and when the shaft does not rotate.

15. The method of claim 14, wherein a voltage standing wave ratio circuit (VSWRC) is electrically connected relative to the stator antenna, the VSWRC being configured for performing the step of comparing the interrogation signal with a reflected signal.

16. The method of claim 15, wherein a controller is configured for performing the method.

17. The method of claim 16, wherein the controller comprises a Full Authority Digital Engine Control (FADEC).

18. The method of claim 13, wherein if indicating that the fault is on the stator side, then propagating a signal and measuring time of the reflected signal to identify a location of the fault along the stator antenna.

19. The method of claim 18, further comprising using a time domain reflectometer (TDR) propagating the signal and measuring the time of the signal reflection.

20. The method of claim 13, wherein the sensor system is on a shaft of an aircraft engine.

* * * * *